(12) United States Patent
Yoshida

(10) Patent No.: US 11,474,156 B2
(45) Date of Patent: Oct. 18, 2022

(54) ELECTRICALLY-DRIVEN VEHICLE AND CONTROL METHOD FOR ELECTRICALLY-DRIVEN VEHICLE

(71) Applicant: TOYOTA JIDOSHA KABUSHIKI KAISHA, Toyota (JP)

(72) Inventor: Hiroshi Yoshida, Anjou (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 823 days.

(21) Appl. No.: 16/251,756

(22) Filed: Jan. 18, 2019

(65) Prior Publication Data
US 2019/0235030 A1   Aug. 1, 2019

(30) Foreign Application Priority Data
Jan. 29, 2018   (JP) .............................. JP2018-012404

(51) Int. Cl.
*G01R 31/3842* (2019.01)
*B60W 10/08* (2006.01)
*G01R 31/36* (2020.01)
*H01M 10/48* (2006.01)
*G01R 31/389* (2019.01)
*G01R 19/165* (2006.01)

(52) U.S. Cl.
CPC ......... *G01R 31/3842* (2019.01); *B60W 10/08* (2013.01); *G01R 19/16542* (2013.01); *G01R 31/3646* (2019.01); *G01R 31/389* (2019.01); *H01M 10/486* (2013.01)

(58) Field of Classification Search
CPC .............. G01R 31/3842; G01R 31/389; G01R 31/3646; G01R 19/16542; B60W 10/08
USPC .......................................................... 702/63
See application file for complete search history.

(56) References Cited

U.S. PATENT DOCUMENTS 6,285,163 B1   9/2001 Watanabe et al.
2012/0101676 A1*  4/2012 Ichioka .................. B60K 6/445
                                                                701/22

(Continued)

FOREIGN PATENT DOCUMENTS

JP          8-140207 A      5/1996
JP       2009-298301 A     12/2009

(Continued)

OTHER PUBLICATIONS

Witte ("The Automobile Storage Battery Its Care and Repair"), 1922, The American Bureau of Engineering, Third Edition. (Year: 1922).*

(Continued)

*Primary Examiner* — Michael P Nghiem
(74) *Attorney, Agent, or Firm* — Sughrue Mion, PLLC

(57) ABSTRACT

An electrically-driven vehicle includes a power storage device that stores power to be supplied to a motor, and a controller that controls output of the power storage device. The controller estimates a SOC of the power storage device. The controller detects output power of the power storage device and calculates an output power upper limit value of the power storage device by using the SOC when a voltage of the power storage device reaches a lower limit voltage during discharge of the power storage device. The controller stops the electrically-driven vehicle in the case where the detected output power is lower than the output power upper limit value.

4 Claims, 5 Drawing Sheets

(56) References Cited

U.S. PATENT DOCUMENTS

| | | | | |
|---|---|---|---|---|
| 2013/0079969 A1* | 3/2013 | Kamijo | ................ | B60W 10/26 |
| | | | | 701/22 |
| 2015/0307086 A1* | 10/2015 | Ketfi-Cherif | ......... | B60W 10/08 |
| | | | | 701/22 |
| 2016/0159238 A1* | 6/2016 | Min | ........................ | B60L 58/12 |
| | | | | 320/109 |
| 2018/0201137 A1* | 7/2018 | Hirasawa | .............. | B60L 15/007 |
| 2019/0064282 A1* | 2/2019 | Haga | .................. | H01M 10/617 |

FOREIGN PATENT DOCUMENTS

| | | |
|---|---|---|
| JP | 2014-7079 A | 1/2014 |
| JP | 2015-139346 A | 7/2015 |
| JP | 2017-087915 A | 5/2017 |
| WO | 99/061929 A1 | 12/1999 |

OTHER PUBLICATIONS

Definition of SOC, printed Mar. 31, 2022. (Year: 2022).*
Definition of State of Charge, Health, Power, printed on Mar. 31, 2022. (Year: 2022).*

* cited by examiner

ELECTRICALLY-DRIVEN VEHICLE AND CONTROL METHOD FOR ELECTRICALLY-DRIVEN VEHICLE

INCORPORATION BY REFERENCE

The disclosure of Japanese Patent Application No. 2018-012404 filed on Jan. 29, 2018 including the specification, drawings and abstract is incorporated herein by reference in its entirety.

BACKGROUND

1. Technical Field

The present disclosure relates to an electrically-driven vehicle and a control method for an electrically-driven vehicle and, in particular, to an output control technique of a power storage device that stores electric power to be supplied to a motor for travelling.

2. Description of Related Art

A travelable distance calculation system for an electrically-driven vehicle that travels by using output of a motor has been disclosed in Japanese Patent Application Publication No. 2015-139346 (JP 2015-139346A). In order to calculate a travelable distance, this system estimates a state of charge (SOC) of a battery (a power storage device) and calculates the travelable distance from the estimated SOC. A SOC-OCV (an open circuit voltage) curve is used to estimate the SOC. More specifically, the SOC-OCV curve is prepared in advance per temperature, and the SOC is calculated from a temperature of the battery and the OCV (see JP 2015-139346A).

SUMMARY

In order to protect the power storage device, an upper limit value (Wout) is set for output power (W) of the power storage device. In the case where such an output power upper limit value (Wout) is calculated by using the SOC and an estimated SOC value has an error, power deficiency (depletion of power storage energy) is possibly and erroneously determined in a situation where the SOC is low. More specifically, the following circumstance possibly occurs. In the case where it is determined that the power storage device still can output the power while the output power upper limit value is decreased in the situation where the SOC is low, the power deficiency actually occurs.

The present disclosure provides an electrically-driven vehicle and a control method for an electrically-driven vehicle capable of suppressing an erroneous determination of power deficiency in the electrically-driven vehicle that travels by using electric power stored in a power storage device.

An electrically-driven vehicle according to a first aspect of the present disclosure travels by using output of a motor and includes: a power storage device that stores power to be supplied to the motor; and a controller configured to control output of the power storage device. The controller is configured to estimate a SOC of the power storage device. The controller is configured to detect output power of the power storage device and calculate an output power upper limit value of the power storage device by using the SOC in the case where the SOC is lower than a specified value and a voltage of the power storage device reaches a lower limit voltage during discharge of the power storage device. The controller is configured to stop the electrically-driven vehicle in the case where the detected output power is lower than the output power upper limit value.

A control method for an electrically-driven vehicle that travels by using output of a motor according to a second aspect of the present disclosure includes: estimating a SOC of a power storage device that stores power to be supplied to the motor; detecting output power of the power storage device and calculating an output power upper limit value of the power storage device by using the SOC in the case where the SOC is lower than a specified value and a voltage of the power storage device reaches a lower limit voltage during discharge of the power storage device; and stopping the electrically-driven vehicle in the case where the detected output power is lower than the output power upper limit value.

In the electrically-driven vehicle and the control method for the electrically-driven vehicle described above, the SOC of the power storage device is estimated, and the output power upper limit value of the power storage device is calculated by using the estimated SOC. When the voltage of the power storage device reaches the lower limit voltage during the discharge of the power storage device, the output power of the power storage device is detected and compared with the output power upper limit value. Then, in the case where the detected output power is lower than the output power upper limit value, processing to stop the electrically-driven vehicle is executed. In this way, the following circumstance is suppressed. Despite a fact that the power storage device cannot actually output the power allowing travel of the electrically-driven vehicle due to power deficiency, the output power upper limit value indicates that the power storage device still can output the power allowing the travel of the electrically-driven vehicle. As a result, an erroneous determination of the power deficiency is made. Just as described, according to the electrically-driven vehicle and the control method for the electrically-driven vehicle described above, it is possible to suppress the erroneous determination of the power deficiency.

In the above aspect, the controller may be configured to stop the electrically-driven vehicle in the case where the output power is lower than the output power upper limit value and the output power is lower than specified power.

When the output power of the power storage device being lower than the specified power is added to an execution condition of processing to stop the electrically-driven vehicle, it is possible to suppress unnecessary execution of the above processing.

In the above aspect, the controller may be configured to switch a state of the electrically-driven vehicle between a READY-ON state indicating a state where the electrically-driven vehicle can travel and a READY-OFF state indicating a state where the electrically-driven vehicle cannot travel, and may be configured to stop the electrically-driven vehicle by switching the state of the electrically-driven vehicle from the READY-ON state to the READY-OFF state.

With such a configuration, it is possible to avoid such a circumstance where the READY-ON state continues even when the electrically-driven vehicle cannot travel due to the power deficiency.

In the above aspect, a notification device that outputs a warning indicating low SOC in the case where the SOC is lower than the specified value may further be included.

With such a configuration, a user of the electrically-driven vehicle can recognize in advance that the SOC is low.

In the above aspect, the controller may be configured to correct the estimated SOC by using the voltage, a current, and an internal resistance value of the power storage device, and the controller may be configured to calculate the output power upper limit value by using the corrected SOC.

With such a configuration, it is possible to suppress a cause of the erroneous determination of the power deficiency by minimizing a difference between the power that can actually be output from the power storage device and the output power upper limit value.

According to the electrically-driven vehicle and the control method for the electrically-driven vehicle in the present disclosure, it is possible to suppress the erroneous determination of the power deficiency.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
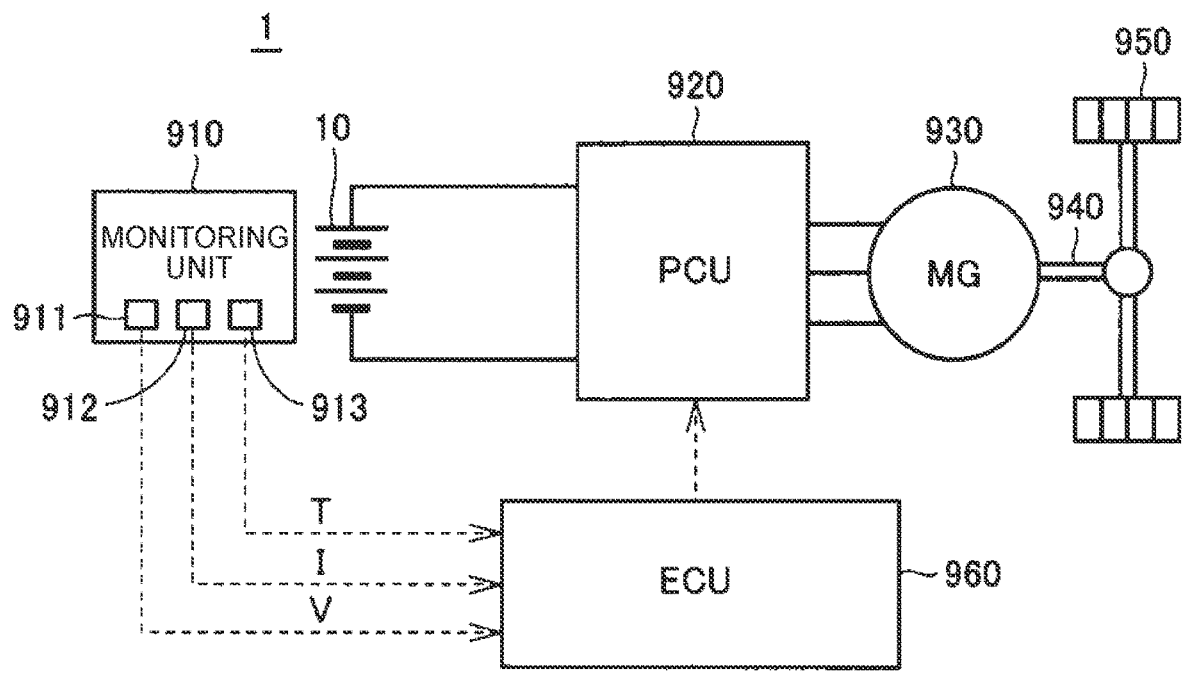
FIG. 1 is a schematic configuration diagram of an electrically-driven vehicle according to an embodiment of the present disclosure.

A detailed description will hereinafter be made on an embodiment of the present disclosure with reference to the drawings. Note that the same or corresponding portions in the drawings are denoted by the same reference numerals and the description thereon will not be repeated.

FIG. 1 is a schematic configuration diagram of an electrically-driven vehicle according to an embodiment of the present disclosure. With reference to FIG. 1, an electrically-driven vehicle 1 includes a battery pack 10, a monitoring unit 910, a power control unit (hereinafter referred to as a "PCU") 920, a motor generator (hereinafter referred to as a "MG") 930, a drive shaft 940, drive wheels 950, and an electronic control unit (hereinafter referred to as an "ECU") 960.

The battery pack 10 is configured to include plural secondary battery cells (hereinafter also simply referred to as "cells"). Each of the cells is configured as a lithium-ion battery or a nickel-metal hydride battery, for example. A module includes the plural cells, and the plural modules are electrically connected to each other to construct the battery pack 10. The battery pack 10 stores power that is used to drive the MG 930, and can supply the power to the MG 930 through the PCU 920. In addition, when the MG 930 generates the power, the battery pack 10 is charged by receiving the generated power through the PCU 920.

The monitoring unit 910 is configured to include a voltage sensor 911, a current sensor 912, and a temperature sensor 913. The voltage sensor 911 detects a voltage V per cell (may include the plural cells that are connected in parallel). The current sensor 912 detects a charging/discharging current I of the battery pack 10, and the temperature sensor 913 detects a temperature T per cell (may be per plural cells). Note that the voltage sensor 911 and the temperature sensor 913 may detect a voltage and a temperature of the entire battery pack 10. In this embodiment, the current sensor 912 detects the discharging current to have a positive value and detects the charging current to have a negative value.

In accordance with a control signal from the ECU 960, the PCU 920 executes bidirectional power conversion between the battery pack 10 and the MG 930. For example, the PCU 920 is configured to include: an inverter that drives the MG 930; and a converter that boosts a DC voltage to be supplied to the inverter to be equal to or higher than an output voltage of the battery pack 10.

The MG 930 is representatively an AC rotary electric machine, and is a three-phase AC synchronous motor in which a permanent magnet is embedded in a rotor, for example. The MG 930 is driven by the PCU 920 to generate rotational driving force. The driving force that is generated by the MG 930 is transmitted to the drive wheels 950 through the drive shaft 940. Meanwhile, during braking of the electrically-driven vehicle 1 or when acceleration is reduced on a downhill, the MG 930 is operated as a generator and generates regenerative power. The power that is generated by the MG 930 is supplied to the battery pack 10 through the PCU 920.

The ECU 960 is configured to include a central processing unit (CPU), memory (read only memory (ROM) and random access memory (RAM)), and an input/output port used to input/output various signals (none of these components are shown). The ECU 960 controls the PCU 920 on the basis of a signal received from each of the sensors as well as programs and maps stored in the memory. In this way, the ECU 960 controls driving of the MG 930 and charging/discharging of the battery pack 10.

In addition, the ECU 960 estimates a SOC of the battery pack 10 on the basis of the current I, which is detected by the current sensor 912, and/or the voltage V, which is detected by the voltage sensor 911. The SOC indicates an amount of the stored power in the battery pack 10 with respect to a fully-charged state thereof by 0 to 100%, and indicates a remaining amount of the stored power in the battery pack 10. Any of various known methods can be used as an estimation method of the SOC.

Furthermore, the ECU 960 uses the estimated SOC to calculate an upper limit value Wout of output power (discharging power) of the battery pack 10.

Figure 2:
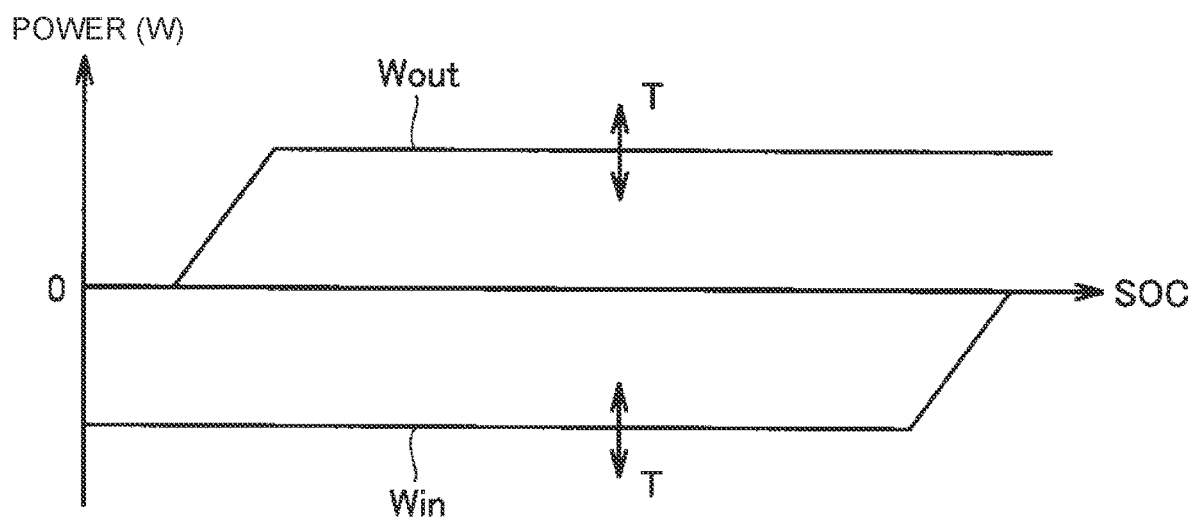
FIG. 2 is a graph illustrating an upper limit value of output power of a battery pack.

FIG. 2 is a graph illustrating the upper limit value Wout of the output power of the battery pack 10. FIG. 2 also shows an upper limit value Win of input power (charging power) to the battery pack 10. With reference to FIG. 2, the output power upper limit value Wout is an upper limit value of power (W) that can be output from the battery pack 10. When the SOC of the battery pack 10 is reduced, the output power upper limit value Wout is limited. In addition, the output power upper limit value Wout is also changed by the temperature T of the battery pack 10. For example, the output power upper limit value Wout is reduced at a low temperature. In this embodiment, a map indicating a corresponding relationship between the SOC and the output power upper limit value Wout is prepared in advance per temperature T, and the output power upper limit value Wout is calculated from the SOC and the temperature T.

The input power upper limit value Win is an upper limit value of the power (W) that can be input to the battery pack 10. When the SOC of the battery pack 10 is increased, the input power upper limit value Win is limited. In addition, the input power upper limit value Win is also changed by the temperature T of the battery pack 10. For example, the input power upper limit value Win is reduced at the low temperature.

As described above, the upper limit value Wout is set for the output power of the battery pack 10. In the case where the estimated SOC value, which is used to calculate the output power upper limit value Wout, has an error, power deficiency (depletion of power storage energy) is possibly and erroneously determined in a situation where the SOC is low. More specifically, the following circumstance possibly occurs. In the case where it is determined that the battery pack 10 still can output the power allowing travel of the vehicle while the output power upper limit value Wout is decreased in the situation where the SOC is low, the battery pack 10 cannot actually output the power allowing travel of the vehicle, and the power deficiency occurs.

Figure 3:
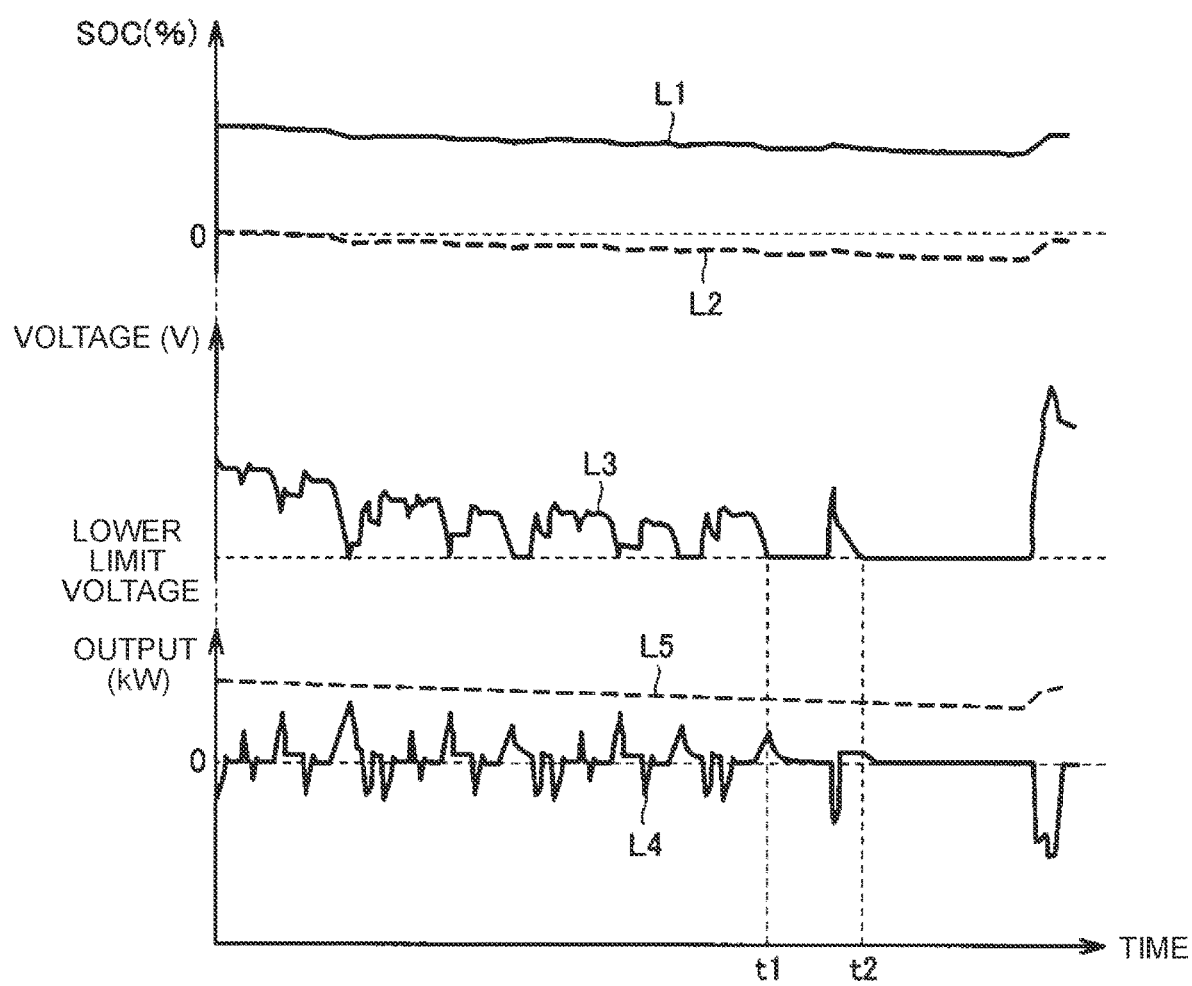
FIG. 3 is a graph illustrating an example of transitions of a SOC, a voltage, and the output power during travel in the case where the SOC is low.

FIG. 3 is a graph illustrating an example of transitions of the SOC, the voltage, and the output power during the travel in the case where the SOC is low. In FIG. 3, a line L1 represents a transition of the estimated SOC value, and a line L2 represents a transition of a true value of the SOC. A line L3 represents a transition of the voltage of the certain cell, and a line L4 represents a transition of the output (kW) of the battery pack 10. Note that the output having a negative value indicates that the battery pack 10 receives (stores) the power. A line L5 represents the output power upper limit value Wout.

With reference to FIG. 3, in this example, the estimated SOC value (the line L1) has an error of being higher than the true value (the line L2). Meanwhile, the output power upper limit value Wout (the line L5), which is calculated from the estimated SOC value, indicates the output power allowing the travel of the vehicle. However, in reality, the battery pack 10 is in an overdischarged state where the SOC (the true value) falls below 0%.

For example, when the voltage (the line L3) reaches a lower limit voltage at time t1 and time t2, the output of the battery pack 10 is limited for a purpose of protecting the battery cells, and the output (the line L4) thereof is controlled to be 0. That is, while the output power upper limit value Wout indicates the output power allowing the travel of the vehicle, the battery pack 10 cannot actually output the power. Thus, an erroneous determination of the power deficiency is made.

In order to suppress such an erroneous determination of the power deficiency, it is considered to improve SOC estimation accuracy. The improved SOC estimation accuracy contributes to suppression of the erroneous determination of the power deficiency as described above. However, it is difficult to eliminate the SOC estimation error, which is caused by a detection error of each of the sensors (the voltage sensor, the current sensor, and the temperature sensor) and an estimation error of cell resistance, and the like, by improving the SOC estimation accuracy. Thus, the erroneous determination of the power deficiency cannot sufficiently be suppressed only by improving the SOC estimation accuracy.

In view of the above, in the electrically-driven vehicle 1 according to this embodiment, in the case where the SOC is reduced and the voltage V reaches the lower limit voltage during discharge of the battery pack 10, the power that is actually output from the battery pack 10 (hereinafter referred to as "actual output Wa") is detected and compared with the output power upper limit value Wout. Then, if the detected actual output Wa is lower than the output power upper limit value Wout, processing to stop the electrically-driven vehicle 1 is executed. In this embodiment, a vehicle state is switched from a READY-ON state to a READY-OFF state. In the READY-ON state, the vehicle can travel. In the READY-OFF state, the vehicle cannot travel.

In this way, the following circumstance is suppressed. Despite a fact that the battery pack 10 cannot actually output the power allowing the travel of the vehicle due to the power deficiency, the output power upper limit value Wout indicates that the battery pack 10 still can output the power allowing the travel of the vehicle. As a result, the erroneous determination of the power deficiency is made. That is, according to the electrically-driven vehicle 1 of this embodiment, it is possible to suppress the erroneous determination of the power deficiency.

As will be described below, in this embodiment, the SOC estimation accuracy is also improved (the "SOC correction processing" in FIG. 4). Although improvement of such SOC estimation accuracy is not essential processing, the improved SOC estimation accuracy can suppress the erroneous determination of the power deficiency and can also appropriately regulate the output of the battery pack 10.

Figure 4:
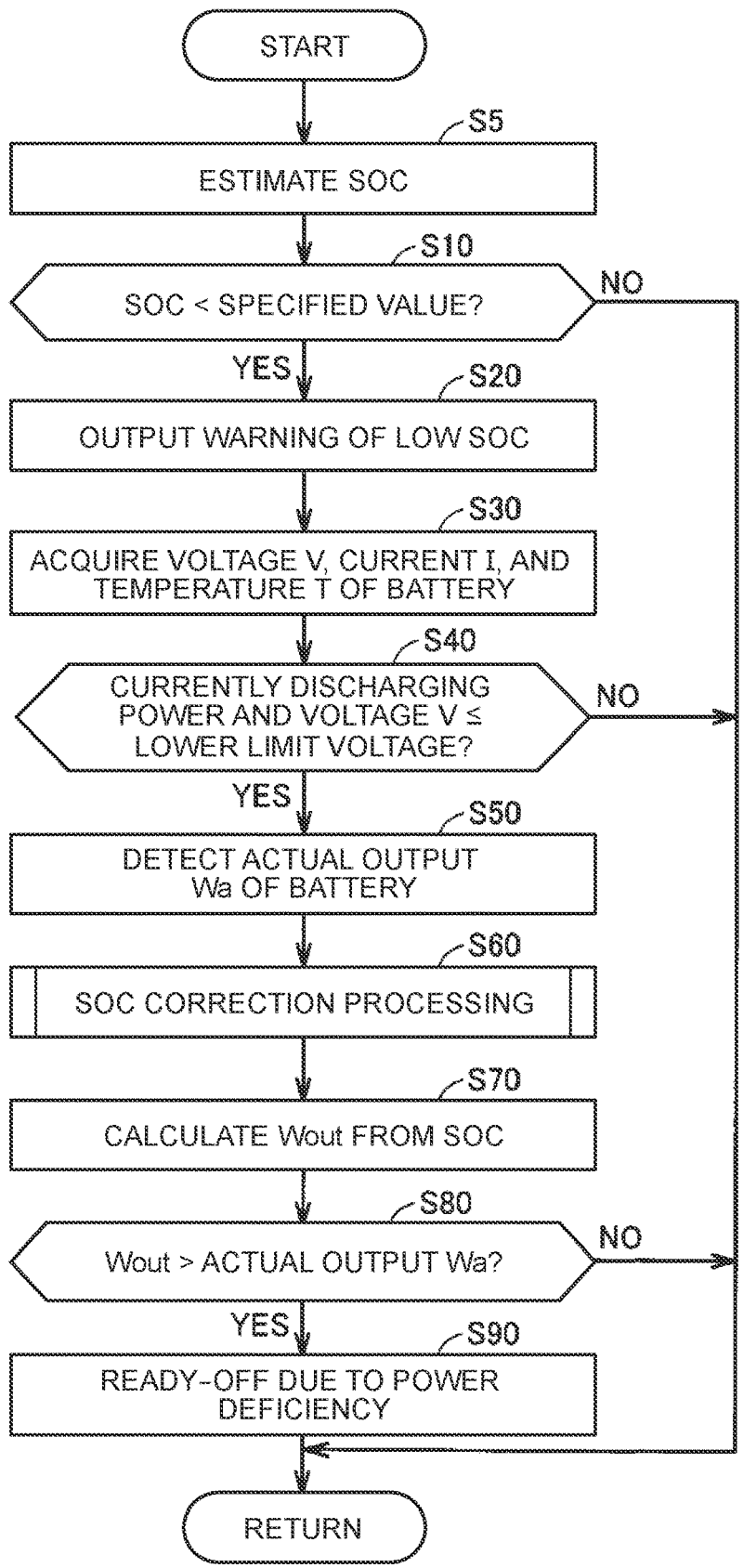
FIG. 4 is a flowchart of an exemplary procedure of power deficiency determination processing executed by an ECU.

FIG. 4 is a flowchart of an exemplary procedure of power deficiency determination processing that is executed by the ECU 960. In the case where the vehicle is in the READY-ON state, a series of the processing illustrated in the flowchart is called up from a main routine and repeatedly executed at specified time intervals or when a specified condition is established.

With reference to FIG. 4, the ECU 960 estimates the SOC of the battery pack 10 (step S5). Any of the various known methods can be used as the estimation method of the SOC. For example, in a region where the SOC and the voltage V are highly correlated with each other (a high SOC region or a low SOC region), an initial SOC is estimated from the voltage V by using a SOC-OCV (voltage) map that is prepared in advance. Then, a SOC fluctuation amount is calculated from an integrated value of the current I and is added to the initial SOC. In this way, the SOC can be estimated.

Next, the ECU 960 determines whether the SOC is lower than a specified value (step S10). The specified value is a SOC value indicating that the SOC is low, and is set to 20%, for example. If the SOC is equal to or higher than the specified value (NO in step S10), the ECU 960 does not execute the series of the subsequent processing, and the processing proceeds to RETURN.

If it is determined that the SOC is lower than the specified value (YES in step S10), the ECU 960 executes processing to output a warning indicating that the SOC is low (step S20). As an example, a display device or a sound device capable of outputting such a warning is provided. When the SOC becomes low, such a device notifies a user of the low SOC.

Then, the ECU 960 acquires detection values of the voltage V, the current I, and the temperature T from the voltage sensor 911, the current sensor 912, and the temperature sensor 913, respectively (step S30). Next, the ECU 960 determines whether the battery pack 10 is currently discharging the power and the voltage V is equal to or lower than the lower limit voltage (step S40). Whether the battery pack 10 is currently discharging the power can be determined on the basis of whether the current I has a positive value. The lower limit voltage is a voltage threshold that is set to protect the battery cell.

If the battery pack 10 is not currently discharging the power, or if the voltage V is higher than the lower limit voltage (NO in step S40), the power deficiency does not occur immediately. Thus, the ECU 960 does not execute the series of the subsequent processing, and the processing proceeds to RETURN.

In step S40, if it is determined that the battery pack 10 is currently discharging the power and the voltage V is equal to or lower than the lower limit voltage (YES in step S40), the ECU 960 detects the actual output Wa (W) of the battery pack 10 (step S50). The actual output Wa is an instantaneous value of the power that is actually output from the battery pack 10 when the voltage V reaches the lower limit voltage. The actual output Wa is calculated on the basis of the detection values of the voltage V and the current I.

Next, the ECU 960 executes the SOC correction processing to correct the SOC that is estimated in step S5 (step S60). Then, the ECU 960 calculates the output power upper limit value Wout by using the corrected SOC and the temperature T, which is acquired in step S30 (step S70). The SOC correction processing is executed to improve the accuracy of the estimated SOC in step S5. Although the SOC correction processing is not the essential processing as described above, the improved SOC estimation accuracy can suppress the erroneous determination of the power deficiency and can also appropriately regulate the output of the battery pack 10.

Note that a detailed description on the SOC correction processing will be given later. In regard to the calculation of the output power upper limit value Wout, for example, a map indicating the corresponding relationship between the SOC and the output power upper limit value Wout as shown in FIG. 2 is prepared in advance per the temperature T, and the output power upper limit value Wout is calculated from the SOC and the temperature T.

Next, the ECU 960 compares the actual output Wa, which is detected in step S50, with the output power upper limit value Wout, which is calculated in step S70, and determines whether the actual output Wa is lower than the output power upper limit value Wout (step S80). Then, if it is determined that the actual output Wa is lower than the output power upper limit value Wout (YES in step S80), the ECU 960 switches the state of the vehicle from the READY-ON state to the READY-OFF state (step S90). In this way, a system of the electrically-driven vehicle 1 is stopped.

By such processing, the following circumstance is suppressed. Despite the fact that the battery pack 10 cannot actually output the power allowing the travel of the vehicle due to the power deficiency, the output power upper limit value Wout indicates that the battery pack 10 still can output the power allowing the travel of the vehicle. As a result, the erroneous determination of the power deficiency is made. That is, it is possible to suppress the erroneous determination of the power deficiency.

Note that, in above step S80, in the case where the actual output Wa is lower than the output power upper limit value Wout and the actual output Wa is lower than specified power, the state of the vehicle may be switched to the READY-OFF state in step S90. For example, minimum battery output that allows the travel of the vehicle is set as the specified power. When the actual output Wa being lower than the specified power is added to a switching condition to the READY-OFF state due to the power deficiency, it is possible to suppress unnecessary switching of the state of the vehicle to the READY-OFF state.

In the above description, the SOC correction processing in step S60 and the calculation of Wout in step S70 may be executed after the detection value of each of the sensors is acquired in step S30, or may be executed before the actual output Wa is detected in step S50.

Figure 5:
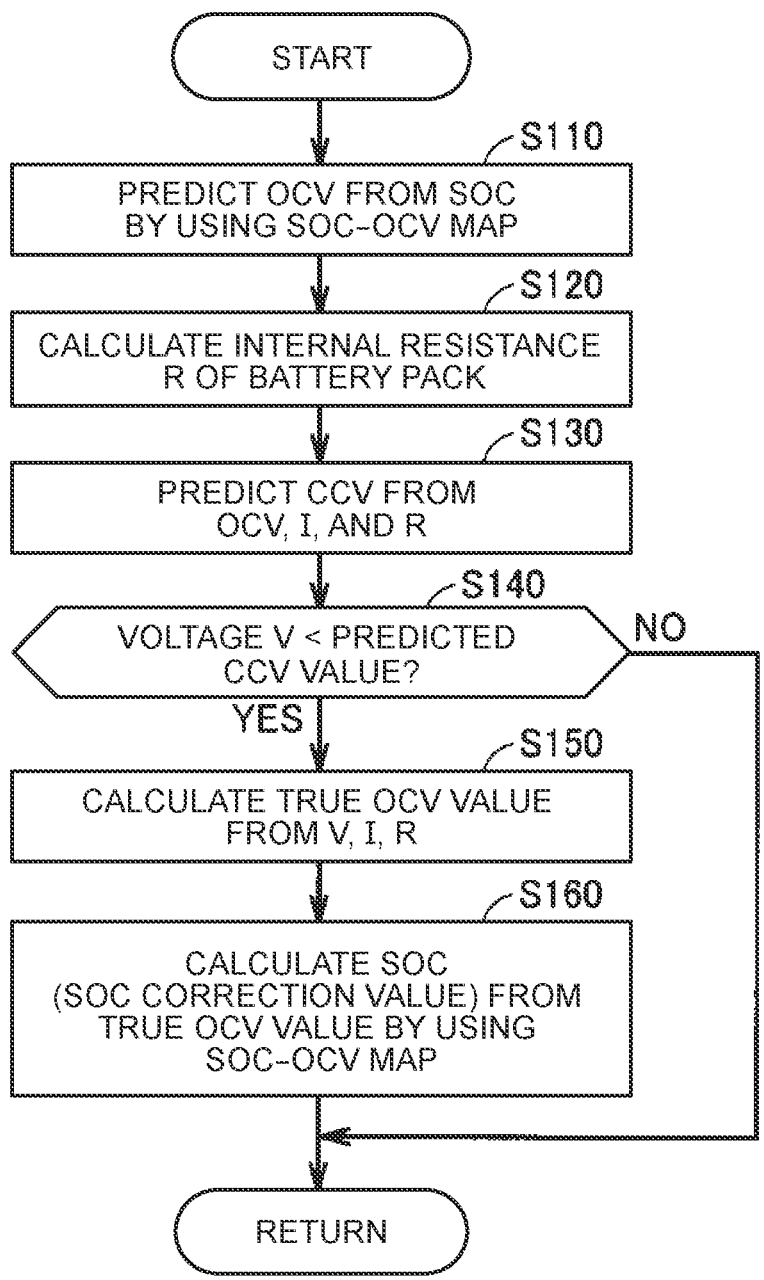
FIG. 5 is a flowchart of an exemplary procedure of SOC correction processing executed in step S60 shown in FIG. 4.

FIG. 5 is a flowchart of an exemplary procedure of the SOC correction processing that is executed in step S60 shown in FIG. 4. With reference to FIG. 5, the ECU 960 uses the SOC-OCV map to calculate a predicted OCV value from the SOC that is estimated in step S5 shown in FIG. 4 (step S110). The SOC-OCV map is prepared in advance and stored in the memory or the like.

Next, the ECU 960 calculates internal resistance R of the battery pack 10 (step S120). For example, a map indicating a corresponding relationship among the SOC, the temperature T, and the internal resistance R is prepared in advance, and the internal resistance R is calculated from the SOC and the temperature T.

Then, according to the following equation (1), the ECU 960 calculates a predicted closed circuit voltage (CCV) value from the OCV predicted in step S110, the detection value of the current I, and the internal resistance R calculated in step S120 (step S130).

The predicted CCV value=the predicted OCV value−I×R (the SOC, T) . . . (1) Next, the ECU 960 determines whether the detection value of the voltage V by the voltage sensor 911 is lower than the above predicted CCV value (step S140). Then, if it is determined that the detection value of the voltage V is lower than the predicted CCV value (YES in step S140), according to the following equation (2), the ECU 960 calculates a true value of the OCV from the detection values of the voltage V and the current I and the internal resistance R calculated in step S120 (step S150).

The OCV true value=V+I×R (the SOC, T) . . . (2) Note that this true OCV value is the true value of the OCV that is predicted from the detection values (actual values) of the voltage V, the current I, and the temperature T.

Then, the ECU 960 uses the SOC-OCV map to calculate a SOC correction value (the estimated SOC value that has been corrected) from the true OCV value, which is calculated in step S150 (step S160). The SOC correction value calculated in this step S160 is used in step S70 shown in FIG. 4.

If it is determined in step S140 that the detection value of the voltage V is equal to or higher than the predicted CCV value (NO in step S140), the ECU 960 does not execute the processing in steps S150, S160, and the processing proceeds to RETURN.

In the above description, the SOC is corrected in the case where the detection value of the voltage V is lower than the predicted CCV value in step S140.

However, regardless of such a comparison result, the SOC may be corrected by the processing in steps S150, S160. That is, in the case where the SOC correction processing is executed, the processing from step S110 to S140 is not the essential processing.

Figure 6:
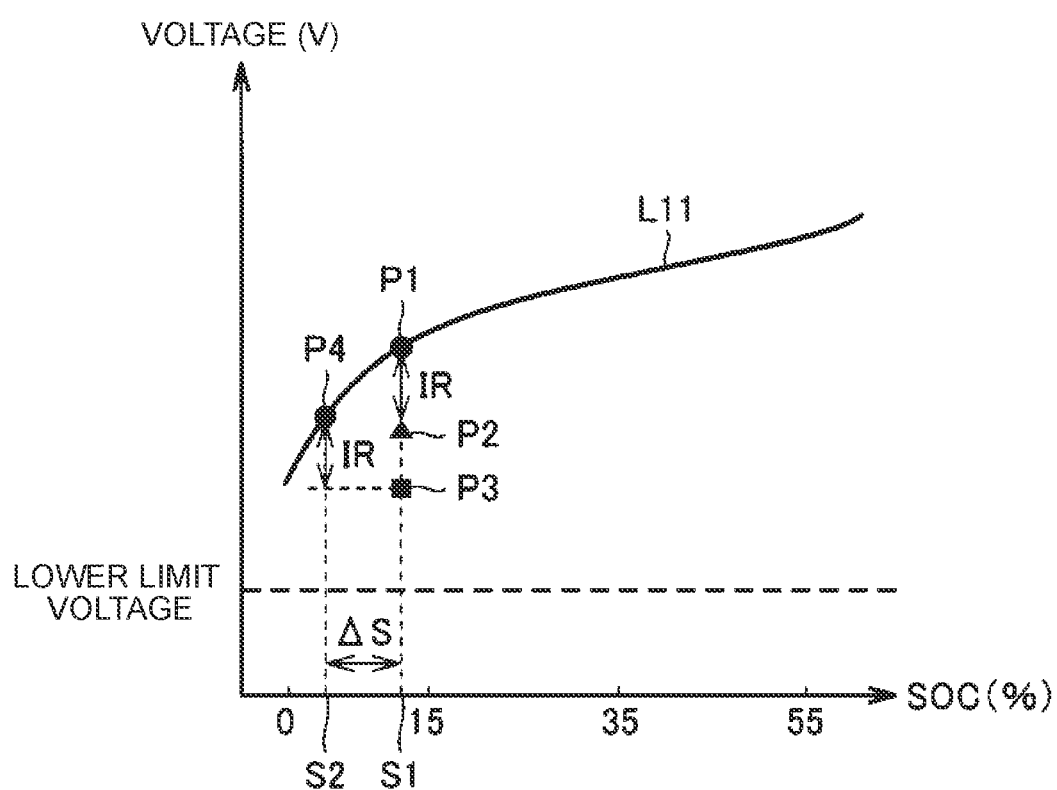
FIG. 6 is a graph illustrating an image of SOC correction by the SOC correction processing.

FIG. 6 is a graph illustrating an image of SOC correction by the SOC correction processing. In FIG. 6, a horizontal axis represents the SOC, and a vertical axis represents the voltage. In addition, a line L11 represents a SOC-OCV curve (map).

With reference to FIG. 6, S1 represents the SOC that is estimated in step S5 shown in FIG. 4 (the SOC before the correction), and a point P1 represents the predicted OCV value that is calculated in step S110 shown in FIG. 5. A point P2 represents the predicted CCV value that is calculated in step S130 shown in FIG. 5. A point P3 represents the detection value of the voltage V (the actual CCV value).

At this time, a point P4 represents the true OCV value that is calculated in step S150 shown in FIG. 5, and S2 that indicates the SOC at the point P4 is the SOC correction value that is calculated in step S160 shown in FIG. 5. A difference ΔS between S1 and S2 corresponds to a correction amount of the estimated SOC.

Note that, as described above, the estimation accuracy of the SOC correction value (S2) is higher than that of the SOC estimated in step S5 shown in FIG. 4; however, the SOC correction value (S2) contains the detection error of each of the sensors (the voltage sensor, the current sensor, and the temperature sensor), an estimation error of the internal resistance R, and the like. In this embodiment, even when the SOC estimation error that is based on such sensor errors and the like is present, it is possible to sufficiently suppress the erroneous determination of the power deficiency.

As it has been described so far, in this embodiment, the SOC of the battery pack 10 is estimated, and the output power upper limit value Wout of the battery pack 10 is calculated by using the estimated SOC. When the voltage V reaches the lower limit voltage during the discharge of the battery pack 10, the actual output Wa of the battery pack 10 is detected and compared with the output power upper limit value Wout. Then, in the case where the detected actual output Wa is lower than the output power upper limit value Wout, the state of the vehicle is switched from the READY-ON state to the READY-OFF state. In this way, the following circumstance is suppressed. Despite the fact that the battery pack 10 cannot actually output the power allowing the travel of the vehicle due to the power deficiency, the output power upper limit value Wout indicates that the battery pack 10 still can output the power allowing the travel of the vehicle. As a result, the erroneous determination of the power deficiency is made. Just as described, according to the above embodiment, it is possible to suppress the erroneous determination of the power deficiency.

In addition to that the actual output Wa is lower than the output power upper limit value Wout, the actual output Wa being lower than the specified power is added to the switching condition to the READY-OFF state. In this way, it is possible to suppress unnecessary switching of the state of the vehicle to the READY-OFF state.

According to this embodiment, the warning indicating that the SOC is low is output in the case where the SOC is lower than the specified value. Thus, the user of the electrically-driven vehicle 1 can recognize in advance that the SOC is low.

According to this embodiment, the estimated SOC is corrected by using the voltage V, the current I, and the internal resistance R of the battery pack 10, and the output power upper limit value Wout is calculated by using the corrected SOC. Thus, it is possible to suppress a cause of the erroneous determination of the power deficiency by minimizing the difference between the actual output Wa and the output power upper limit value Wout.

It should be understood that the embodiment disclosed herein is illustrative in all respects and not restrictive. The scope of the invention is defined by the claims rather than the description of the above embodiment, and intends to include all modifications falling within the claims and equivalents thereof.

What is claimed is:

1. An electrically-driven vehicle that travels by using output of a motor, the electrically-driven vehicle comprising:
    a battery that stores power to be supplied to the motor; and
    a controller configured to control output of the battery, wherein the controller is programmed to:
        estimate a state of charge (SOC) of the battery,
        determine whether the SOC is lower than a specified value,
        acquire a voltage of the battery when the SOC is determined to be lower than the specified value,
        detect output power of the battery only when the acquired voltage of the battery reaches a lower limit voltage and the battery is discharging,
        calculate an output power upper limit value of the battery by using a value of the SOC when the SOC is determined to be lower than the specified value, and
        stop the electrically-driven vehicle when the detected output power is lower than the output power upper limit value.

2. The electrically-driven vehicle according to claim 1, wherein:
    the controller is configured to switch a state of the electrically-driven vehicle between a READY-ON state indicating a state where the electrically-driven vehicle can travel and a READY-OFF state indicating a state where the electrically-driven vehicle cannot travel; and
    the controller is configured to stop the electrically-driven vehicle by switching the state of the electrically-driven vehicle from the READY-ON state to the READY-OFF state.

3. The electrically-driven vehicle according to claim 1, wherein:
    the controller is further programmed to:
    correct the estimated SOC by using the voltage, a current, and an internal resistance value of the battery; and
    calculate the output power upper limit value by using the corrected SOC.

4. A control method for an electrically-driven vehicle that travels by using output of a motor, the control method comprising:
    estimating a state of charge (SOC) of a battery that stores power to be supplied to the motor;
    determining whether the SOC is lower than a specified value;
    acquiring a voltage of the battery when the SOC is determined to be lower than the specified value,
    detecting output power of the battery only when the acquired voltage of the battery reaches a lower limit voltage and the battery is discharging; and
    calculating an output power upper limit value of the battery by using a value of the SOC when the SOC is determined to be lower than the specified value; and
    stopping the electrically-driven vehicle when the detected output power is lower than the output power upper limit value.

* * * * *